(12) United States Patent
El-Hanany et al.

(10) Patent No.: US 9,847,369 B2
(45) Date of Patent: Dec. 19, 2017

(54) HIGH-PERFORMANCE RADIATION DETECTORS AND METHODS OF FABRICATING THEREOF

(71) Applicant: REDLEN TECHNOLOGIES, INC., Saanichton (CA)

(72) Inventors: Uri El-Hanany, Vancouver (CA); Adam Densmore, Victoria (CA); Saeid Taherion, Victoria (CA); Georgios Prekas, Sidney (CA); Veeramani Perumal, Victoria (CA)

(73) Assignee: REDLEN TECHNOLOGIES, INC., Saanichton (CA)

(*) Notice: Subject to any disclaimer, the term of this patent is extended or adjusted under 35 U.S.C. 154(b) by 214 days.

(21) Appl. No.: 15/014,707

(22) Filed: Feb. 3, 2016

(65) Prior Publication Data
US 2016/0240584 A1    Aug. 18, 2016

Related U.S. Application Data

(60) Provisional application No. 62/116,957, filed on Feb. 17, 2015, provisional application No. 62/201,757, filed on Aug. 6, 2015.

(51) Int. Cl.
*H01L 27/14* (2006.01)
*H01L 27/146* (2006.01)
(Continued)

(52) U.S. Cl.
CPC .. *H01L 27/14696* (2013.01); *H01L 27/14658* (2013.01); *H01L 27/14661* (2013.01);
(Continued)

(58) Field of Classification Search
CPC ......... H01L 27/14658; H01L 27/14661; H01L 27/14687; H01L 27/14696;
(Continued)

(56) References Cited

U.S. PATENT DOCUMENTS

| 5,905,264 A | 5/1999 | Shahar et al. |
| 6,043,106 A | 3/2000 | Mescher et al. |

(Continued)

OTHER PUBLICATIONS

International Search Report and Written Opinion for PCT/IB2016/050552, dated Apr. 1, 2016, 9 pages.
(Continued)

*Primary Examiner* — Whitney T Moore
*Assistant Examiner* — Joseph Galvin, III
(74) *Attorney, Agent, or Firm* — The Marbury Law Group PLLC

(57) ABSTRACT

A method of fabricating a solid state radiation detector method includes mechanically lapping and polishing the first and the second surfaces of a semiconductor wafer using a plurality of lapping and polishing steps. The method also includes growing passivation oxide layers by use of oxygen plasma on the top of the polished first and second surfaces in order to passivate the semiconductor wafer. Anode contacts are deposited and patterned on top of the first passivation oxide layer, which is on top of the first surface. Cathode contacts, which are either monolithic or patterned, are deposited on top of the second passivation oxide layer, which is on the second surface. Aluminum nitride encapsulation layer can be deposited over the anode contacts and patterned to encapsulate the first passivation oxide layer, while physically exposing a center portion of each anode contact to electrically connect the anode contacts.

17 Claims, 5 Drawing Sheets

(51) Int. Cl.
*H01L 31/0224* (2006.01)
*H01L 31/18* (2006.01)

(52) U.S. Cl.
CPC .. *H01L 27/14687* (2013.01); *H01L 27/14698* (2013.01); *H01L 31/022408* (2013.01); *H01L 31/1832* (2013.01)

(58) Field of Classification Search
CPC ....... H01L 27/14698; H01L 31/022408; H01L 31/1832
See application file for complete search history.

(56) References Cited

U.S. PATENT DOCUMENTS

| | | | |
|---|---|---|---|
| 6,046,068 | A | 4/2000 | Orava et al. |
| 6,168,967 | B1 | 1/2001 | Hoffbauer et al. |
| 6,188,089 | B1 | 2/2001 | Spartiotis |
| 6,215,123 | B1 | 4/2001 | Orava et al. |
| 6,410,922 | B1 | 6/2002 | Spartiotis et al. |
| 7,589,324 | B2 | 9/2009 | Chen et al. |
| 7,955,992 | B2 | 6/2011 | Chen et al. |
| 8,093,094 | B2 | 1/2012 | Stahle et al. |
| 8,314,395 | B2 | 11/2012 | Zhang et al. |
| 8,476,101 | B2 | 7/2013 | Chen et al. |
| 8,492,728 | B2 | 7/2013 | Antonuk | |
| 2008/0149844 | A1* | 6/2008 | Chen ............... G01T 1/241 250/370.13 |
| 2010/0032579 | A1* | 2/2010 | Chen ............... G01T 1/24 250/370.13 |
| 2011/0156198 | A1* | 6/2011 | Chen ............... H01L 31/02966 257/448 |
| 2013/0126999 | A1* | 5/2013 | Rusian ............. H01L 31/085 257/428 |

OTHER PUBLICATIONS

Bolotnikov et al., "Charge Loss Between Contacts of CdZnTe Pixel Detectors", Nucl. Instr. and Meth. A, (1999), 432, 326-331.

Chen et al., "Passivation of CdZnTe surfaces by oxidation in low energy atomic oxygen", J. Vac. Sci. Technol. A, 1999, 17(1), 97-101.

Mescher et al., "Development of Dry Processing Techniques for CdZnTe Surface Passivation", Journal of Electronic Materials, 1999, 28, 700-704.

Nemirovski et al., "Plasma anodization of Hg1-xCdxTe", Appl. Phys. Lett., 1980, 37(9), 813-815.

Prettyman et al., "Performance of CdZnTe detectors passivated with energetic oxygen atoms", Nuclear Instruments and Methods in Physics Research A, 1999, 422, 179-184.

Stahle et al., "Fabrication of CdZnTe strip detectors for large area arrays", Proc. SPIE Hard X-Ray and Gamma-Ray Detector Physics, Optics, and Applications, 1997, 3115, 90-97.

International Preliminary Report on Patentability for International Patent Application No. PCT/IB2016/050552, dated Aug. 31, 2017, 7 pages.

* cited by examiner

HIGH-PERFORMANCE RADIATION DETECTORS AND METHODS OF FABRICATING THEREOF

RELATED APPLICATIONS

The instant application claims the benefit of U.S. Provisional Application No. 62/116,957, filed on Feb. 17, 2015, and U.S. Provisional Application No. 62/201,757, filed Aug. 6, 2015, the entire contents of which are incorporated herein by reference.

FIELD

The present application is directed to the field of radiation detectors and methods of fabricating the same.

BACKGROUND

The subject matter disclosed herein relates generally to radiation detectors for medical imaging, such as in Low-Flux applications in Nuclear Medicine (NM), whether by Single Photon Emission Computed Tomography (SPECT) or by Positron Emission Tomography (PET), or as radiation detectors in High-Flux applications as in X-ray Computed Tomography (CT) for medical applications and for non-medical imaging application such as in baggage scanning.

Room temperature pixelated radiation detectors made of semiconductors, such as Cadmium Zinc Telluride (CdZnTe or CZT), are gaining popularity for use in medical and non-medical imaging. These applications dictate that these detectors have to exhibit both high energy resolution and high sensitivity. Since these detectors form a crucial part of complex imaging systems they should be highly reliable with a cost low enough to suit market requirements.

Semiconductor radiation detectors generally include two surfaces, one having a plurality of pixelated anode electrical contacts, and the second having a monolithic cathode electrical contact. Prior to the application of the electrical contacts, the first and the second surfaces are commonly etched by chemical wet etching. For CZT radiation detectors, the wet etching is performed in order to remove the mechanical damage from the first and second surfaces. This damage is introduced by previous fabrication steps where the semiconductor wafers have been sliced and polished to form surfaces. Furthermore, the wet etching forms tellurium rich surfaces, which is used to produce electrical contacts with favorable characteristics.

The tellurium rich first surface on which the anode contacts are applied have non-metallized regions between the anode contacts. The excess tellurium in these regions causes reduced surface resistance between the contact pads. It has been shown in an article by Bolotnikov et al., "Charge Loss Between Contacts Of CdZnTe Pixel Detectors", Nucl. Instr. and Meth. A, (1999), 432, 326-331 that these low surface resistance surfaces between the anode contact pads cause charge loss of the events attracted to the anode contacts. This incomplete charge collection causes impairment of the energy resolution and the sensitivity of these detectors. Furthermore, low surface resistance has been shown to degrade the signal stability over time. This instability results in detectors that are unreliable.

SUMMARY

To prevent the detrimental effect of the low surface resistance of the regions between the anodes, in certain embodiments the first surface of the semiconductor wafer is mechanically polished by a sequence including a plurality of polishing steps, wherein a last polishing step of the polishing sequence includes polishing with slurry having a grain size smaller than about 0.1 µm to form a polished first surface. Certain embodiments also include growing a passivation oxide layer on top of the polished first surface using a dry process without wet chemical etching, in order to passivate and stabilize the polished first surface. Then patterned metal contacts are deposited on top of the passivation oxide layer having at least one pattern being (i) a pattern of pixel anodes or (ii) a pattern of pixel anodes with grid electrodes having lines of electrodes aligned along centers of gaps between the anodes.

In certain embodiments the second surface is etched by chemical wet etching in order to remove the remnant mechanical damage from previous fabrication steps and to make it tellurium rich, to produce a desired electrical contact. These embodiments also include application of a protecting layer on the patterned deposited metal contacts to protect the metal pattern on the first surface, etching a second surface of the semiconductor and applying a monolithic cathode electrode on the etched second surface of the semiconductor, then removing the protecting layer from the patterned metal contacts on the first surface.

In one embodiment, a method for fabricating a radiation detector is provided. First and second surfaces of a semiconductor wafer are mechanically polished using a polishing sequence including a plurality of polishing steps, wherein a last polishing step of the polishing sequence includes polishing with a slurry having a grain size smaller than 0.1 µm to form polished first and second surfaces. A first passivation oxide layer is grown over the polished first surface and a second passivation oxide layer is grown over the polished second surface, respectively. Patterned metal contacts are formed on top of the first passivation oxide layer, wherein the patterned metal contacts comprise a pattern of pixel anodes. A monolithic, segmented or pixelated cathode electrode is formed on the second passivation oxide layer.

In another embodiment a method for fabricating a radiation detector comprises: forming a first passivation oxide layer on a first surface of the semiconductor wafer, forming a second passivation oxide layer on a second surface of the semiconductor wafer, forming patterned metal contacts over the first passivation oxide layer, wherein the patterned metal contacts comprise a pattern of pixel anodes, forming a cathode electrode over the second passivation oxide layer, depositing an aluminum nitride (AlN) encapsulating layer over the pattern of pixelated anodes, forming a metallic hard mask layer over the AlN encapsulating layer, forming a photoresist pattern over the metallic hard mask layer, etching portions of the metallic hard mask layer exposed by the photoresist pattern using an acidic etchant and using the AlN encapsulating layer as an etch stop to form hard mask openings in the metallic hard mask layer, and etching portions of the AlN encapsulating layer exposed in the hard mask openings using a basic etchant to form the openings in the AlN encapsulating layer.

In yet another embodiment, a method for fabricating a radiation detector comprises forming a first passivation oxide layer on a first surface of the semiconductor wafer, forming a second passivation oxide layer on a second surface of the semiconductor wafer, forming patterned metal contacts over the first passivation oxide layer, wherein the patterned metal contacts comprise a pattern of pixel anodes, forming a cathode electrode over the second passivation oxide layer, forming a lift-off mask pattern on the pattern of pixel anodes such that edge portions of the pixilated anodes are exposed by the lift-off mask pattern, depositing an AlN encapsulating layer over the edge portion of the pixilated anodes and over the lift-off mask pattern, and lifting-off the lift-off mask pattern and portions of the AlN encapsulating layer located over the lift-off mask pattern to form openings in the AlN layer encapsulating layer.

BRIEF DESCRIPTION OF THE DRAWINGS

FIGS. 1-4A are side cross sectional view diagrams illustrating the fabrication steps involved in the production of radiation detectors according to the embodiments of the invention.

FIG. 1 is a schematic of the first processing step of producing a radiation detector from the semiconductor wafer 100 that may be made of a CZT wafer, with a top, first surface 101 and a lower, second surface 102, which are mechanically lapped and polished to form very finely polished surfaces with very low remnant damage from the previous fabrication steps.

FIG. 2 shows the formation of a first passivation oxide layer 103 grown on the first surface 101 of the semiconductor wafer 100 and a second passivation oxide layer 104 grown on the second surface 102 of the semiconductor wafer 100.

FIG. 3 schematically illustrates the step of the application of metal contacts on top of the first passivation oxide layer 103 to form anodes 105 with gaps 106 between the anodes 105.

FIG. 4A schematically illustrates the step of the application of cathode contact 107, which may be applied as a monolithic, segmented or pixelated electrode on top of the second passivation oxide layer 104 which is on top of the second surface 102 of the semiconductor wafer 100. The steps described in FIG. 3 or FIG. 4 can be interchanged. In other words, the cathode contact can be deposited first and then the anode contact can be performed second.

DETAILED DESCRIPTION

Figure 1:
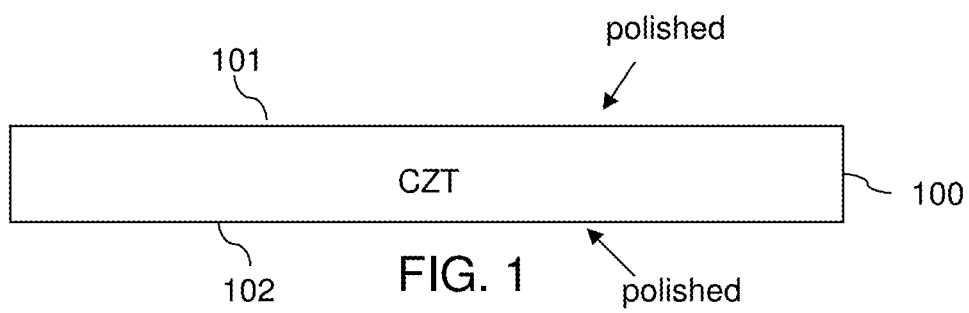

Described herein are various embodiments for fabricating a radiation detector. As used herein, a configuration in which a first element that is formed or located "over" a second element is a configuration in which the first element and the second element are in a generally facing configuration, and may, or may not, have a direct contact (physical contact) between the first and second elements. A configuration in which a first element that is formed or located "on" a second element is a configuration in which the first element and the second element are attached to each other directly or through at least one intermediate element. A configuration in which a first element that is formed or located "directly on" a second element is a configuration in which the first element and the second element are in physical contact with each other. Ordinals such as "first" and "second" are employed merely to distinguish similar elements, and different ordinals may be employed to refer to same elements across the specification and the claims. A "top" side and a "bottom" side refer to relative orientations when a structure is viewed in a certain manner, and orientations of a structure and labeling of respective portions change upon rotation of the structure.

To prevent the detrimental effect of the low surface resistance of the regions between the anodes, in certain embodiments the first surface of the semiconductor wafer is mechanically polished by a sequence including a plurality of polishing steps, wherein a last polishing step of the polishing sequence includes polishing with slurry having a grain size smaller than about 0.1 µm to form a polished first surface. Certain embodiments also include growing a first passivation oxide layer on top of the polished first surface using a dry process without wet chemical etching, in order to passivate and stabilize the polished first surface. Then patterned metal contacts are deposited on top of the first passivation oxide layer having at least one pattern being (i) a pattern of pixel anodes or (ii) a pattern of pixel anodes with grid electrodes having lines of electrodes aligned along centers of gaps between the anodes.

While the first passivation oxide layer on top of the polished first surface passivates and stabilizes the polished first surface, the first passivation oxide layer is not absolutely immune to impairment by humidity and other atmospheric gases and possible damage during handling. Thus, in order protect the first passivation oxide layer which is exposed in the regions between the anode pixels against degrading effect which will deteriorate the long-time reliability of the detectors, in certain embodiments an encapsulating layer is applied on top of the first passivation oxide layer and the overlaid pattern of metallic contacts of the anode surface. This layer is delineated in such a way that openings are formed in it, coinciding with the anode pixel contacts, where the dimensions of these openings are smaller than the dimensions of the contacts. These openings allow efficient and reliable attachment of the radiation detector to a carrier of electronic devices, which has contacts geometrically matching to the anode contacts, by using a conductive material (either conductive epoxy or low-temperature solder.)

In certain embodiments, the second surface is etched by chemical wet etching in order to remove the remnant mechanical damage from previous fabrication steps and to make it tellurium rich, to produce a desired electrical contact. These embodiments also include application of a protecting layer on the patterned deposited metal contacts to protect the metal pattern on the first surface, etching a second surface of the semiconductor and applying a monolithic cathode electrode on the etched second surface of the semiconductor, then removing the protecting layer from the patterned metal contacts on the first surface.

Various embodiments provide methods for fabricating a radiation detector, such as a pixelated radiation detector without chemical etching to remove damaged layers. Accordingly, in various embodiments, no chemical etching is used between the anode contacts.

Various embodiments provide methods for fabricating a radiation detector, such as a radiation detector where the cathode side is fabricated without chemical etching to remove damaged layers. Accordingly, in various embodiments, no chemical etching is used to form the cathode contacts.

Methods are described below for fabricating a radiation detector, such as a pixelated radiation detector wherein the surface of the anodes is produced by a complete dry-process with no wet chemical etch, which may be active after the detector fabrication and may result in lower surface resistivity and detector performances that degrade less with time. In these methods the surface side of the anodes is passivated, by a passivation process, which produces surface stabilization that may result in high surface resistivity.

Methods are described below for fabricating a radiation detector may further include encapsulation of the inter-pixel regions of the first passivation oxide layer which are exposed to the atmosphere in order to prevent degradation of the passivation effect of that layer. The methods described below include the deposition of a layer of Aluminum Nitride (AlN) on top of the first passivation oxide layer and the overlaid pattern of metallic contacts of the anode surface, and then delineating (i.e., patterning) it to form openings that coincide with the pixel anode contacts, where the dimensions of these openings are smaller than the dimensions of the contacts. This method thus offers an effective encapsulating of the detector since no portion of the first passivation oxide layer is exposed to environmental deleterious effects and possible damage during handling. Further, such a method offers a safe and efficient way to attach the radiation detector to a carrier of electronic devices by using a conductive material, such as conductive epoxy or low-temperature solder metal, for contacting the anode pixels to the contacts on the carrier.

Methods are described below for fabricating a radiation detector, such as a detector wherein the surface of the cathode is produced by a complete dry-process with no wet chemical etch, which may be active after the detector fabrication and may result in lower surface resistivity and detector performances that degrade less with time. In these methods the surface side of the cathode is passivated, by a passivation process, which stabilizes the surface, resulting in high surface resistivity.

Methods are described below for producing a pixelated semiconductor radiation detector may be performed by a simple process which on the anodes side does not include any wet chemical etching, lift-off process, and may not include photolithography in some embodiments. The pixelated semiconductor radiation detectors produced in accordance with various embodiments may have electrical contacts as anodes that are deposited on the first passivation oxide layer, which by nature of being a very thin oxide, facilitates carrier tunneling through it via defect levels within said layer.

The methods described below to produce a pixelated semiconductor radiation detector may be performed by a simple process which on the cathode side as well does not include any wet chemical etching, lift-off process, and may not include photolithography in some embodiments. The pixelated semiconductor radiation detectors produced in accordance with various embodiments may have electrical contacts as monolithic, segmented or pixelated cathodes that are deposited on a second passivation oxide layer, which by nature of being a very thin oxide, facilitates carrier tunneling through it via defect levels within said layer.

In various embodiments a dry fabrication process may be provided as illustrated in FIGS. 1-4A, for example, to fabricate pixelated radiation detector as is described below. In particular, FIG. 1 illustrates the first processing step of producing a radiation detector. FIG. 1 schematically shows the semiconductor substrate (e.g., semiconductor wafer) 100, such as a cadmium zinc telluride (CZT) wafer, having a top, first surface 101 and a lower, second surface 102. In the first fabrication step as shown in FIG. 1, the first and second surfaces 101 and 102 of the semiconductor wafer 100 are mechanically lapped and polished in a process that may include double sided lapping and polishing or consecutive one sided lapping and polishing, later referred to in general as polishing. The polishing includes several polishing steps in which each successive polishing step is performed with a slurry having grains (i.e., polishing particles), such as alumina, silicon carbide or diamond grains, which are smaller than the grains in the slurry of the previous polishing step. In each polishing step of the semiconductor wafer 100, the mechanical damage left on the surface of semiconductor wafer 100, after the polishing step, is proportional to the grain size in the slurry used in this polishing step. The last polishing step of the polishing sequence includes polishing with slurry having a grain size smaller than 0.1 μm to form very finely polished surfaces with very low remnant damage from the previous fabrication steps.

Figure 2:
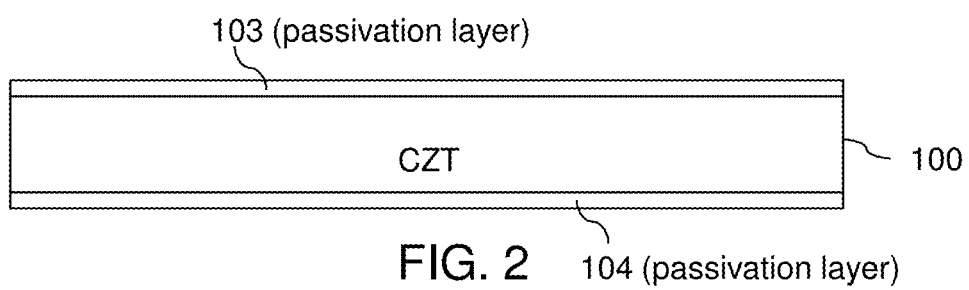

FIG. 2 shows the formation of a first passivation oxide layer 103 grown on the first surface 101 of the semiconductor wafer 100 and a second passivation oxide layer 104 grown on the second surface 102 of the semiconductor wafer 100. The first passivation oxide layer 103 and the second passivation oxide layer 104 may be formed by growing those passivation layers on top of the semiconductor wafer 100 in one embodiment using a plasma process that may include steps of:

1. Cleaning the first and second surfaces 101 and 102 by using plasma of argon, hydrogen or a mixture of them and with other gases to clean the first and second surfaces 101 and 102 from any residual contamination from the polishing process that might have been not entirely cleaned by the routine cleaning stages following the polishing stage. The cleaning process is enabled by creating volatile components of the remnant contamination which is purged out of the chamber where the semiconductor wafer 100 is placed. The plasma of the mixture of gasses is formed by of the gases by coupling energy necessary for plasma creation by frequencies in the kHz range or frequencies in the MHz range, or by frequencies in the microwave (GHz) radiation, or by DC high voltage, or by discharge mechanism or DC magnetron inside a sputtering or an E-beam chamber.

2. Growing a first passivation oxide layer 103 on the top first surface 101 and a second passivation oxide layer 104 on the lower second surface 102 by a flow of oxygen plasma at a pressure lower than 1 mTorr at a sufficient flow rate to sustain the pressure. The plasma of the oxygen is formed by an ionizing process by coupling enough power necessary for plasma creation by frequencies in the kHz range or frequencies in the MHz range, or by frequencies in the microwave (GHz) radiation, or by DC high voltage, or by discharge mechanism or DC magnetron inside a sputtering or an E-beam chamber.

The thicknesses of the first and second passivation oxide layers 103 and 104 can be a few nanometers (nm) each. This thickness increases with the plasma processing time until reaching a saturated thickness value of about 5-6 nm.

In the case of the CZT semiconductor wafer 100, the first and second passivation oxide layers 103 and 104 include a combination of Tellurium Oxide ($TeO_2$), TeO, CdO, $CdTeO_3$, and/or $TeO_3$. This passivation layer, by nature of being a very thin oxide, provides a strong tunneling effect through it.

Figure 3:
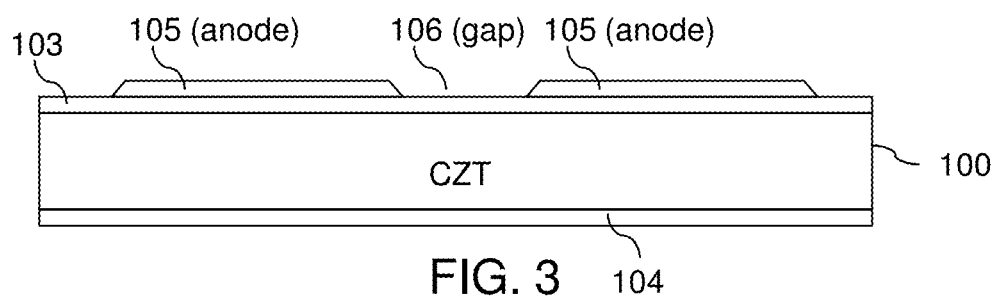

FIG. 3 schematically illustrates the step of the application of metal contacts on top of the first passivation oxide layer 103 to form anodes 105 (i.e., anode electrode pixels) with gaps 106 between the anodes 105. Portions of the top surface of the grown first passivation oxide layer 103 are physically exposed at the gaps 106. Without the passivation oxide layer 103, the semiconductor wafer 100 would be exposed at the gaps 106, causing low surface resistance between the anodes 105, and thus impairing the performance of the radiation detector. The presence of the first passivation oxide layer 103 at the gaps 106 provides a high surface resistance between the anodes 105 for use in a high performance radiation detector.

The first passivation oxide layer 103 ensures that the CZT surface under layer 103 is chemically inactive since it has not been chemically etched and the passivation process has stabilized its surface states. Thus, the surface is very stable and suitable for producing radiation detectors that do not degrade with time.

The anodes 105 may be deposited by a physical vapor deposition method (e.g., evaporation or sputtering) in a vacuum chamber or by a chemical deposition method (e.g., chemical plating, electroplating or chemical vapor deposition). The anodes 105 may be patterned during physical vapor deposition by shadow-mask methods or after deposition by physical or chemical deposition methods by photolithography and etching techniques.

Figure 4A:
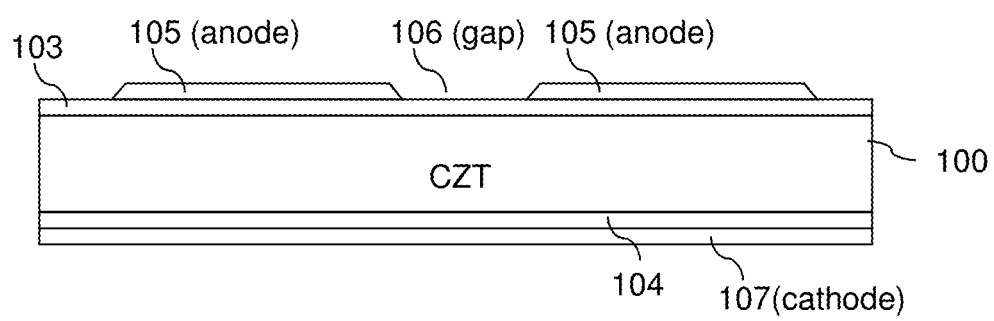

FIG. 4A schematically illustrates the step of the application of cathode (e.g., cathode contact) 107, which may be applied as a monolithic, segmented or pixelated electrode on top of the second passivation oxide layer 104 which is located on the second surface 102 of the semiconductor wafer 100. This cathode electrode 107 may be deposited by a physical vapor deposition method (e.g., evaporation or sputtering) in a vacuum chamber or by a chemical deposition method (e.g., chemical plating, electroplating or chemical vapor deposition). The cathode electrode 107 may be patterned during physical vapor deposition by shadow-mask methods or after deposition by physical or chemical deposition methods by photolithography and etching techniques.

The metals used to form the pixelated anode electrodes 105 and the cathode electrode 107 may include least one of indium, gold, platinum, nickel, titanium, chromium, aluminum, alloys thereof, or a stack of layers including some or all of these metals.

Figure 4B:
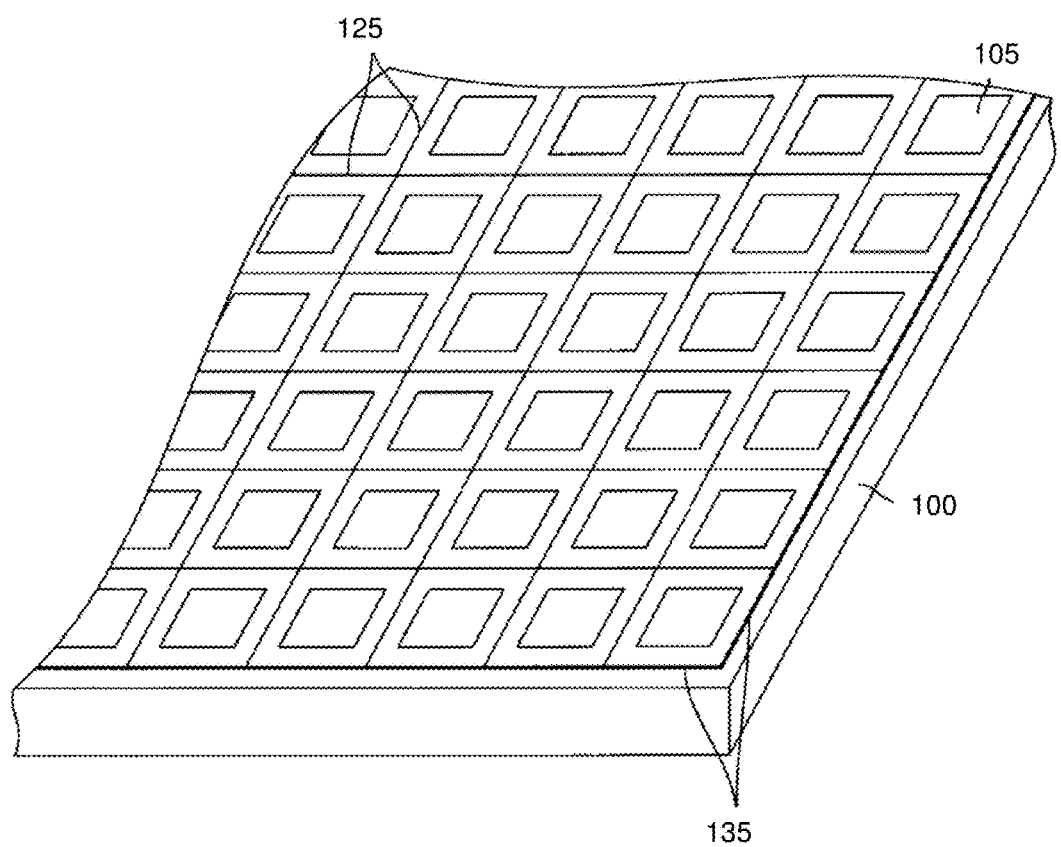
FIG. 4B is a perspective view of the device of FIG. 4A with lines of grid extending along centers of gaps between the anodes and encompassed by a continuous or segmented metal band referred to as a guard ring.

As shown in FIG. 4B, the patterned metal contacts deposited on top of the first passivation oxide layer 103 located on top of the first surface 101 have at least one pattern selected from: (i) a pattern of pixel anodes 105; (ii) a pattern of pixel anodes 105 with grid electrodes 125 comprising lines of steering grid electrodes aligned along centers of gaps 106 between the anodes 105; or (iii) a pattern of pixilated anodes 105 with grid electrodes 125 and a guard ring 135, which comprises a continuous or segmented metal band encompassing (i.e., surrounding) the anodes 105.

In one embodiment, a method for fabricating a radiation detector is provided. The method can include the steps of: mechanically polishing the first and the second surfaces of a semiconductor wafer using a polishing sequence including a plurality of polishing steps, wherein a last polishing step of the polishing sequence includes polishing with a slurry having a grain size smaller than 0.1 μm to form polished first and second surfaces; growing a passivation oxide layer (i) on a top of the polished first and second surfaces to passivate those surfaces or (ii) on top of those polished surfaces that are subsequently chemically etched prior to the passivation; depositing patterned metal contacts on top of the passivation oxide layer which is on top of the first surface having at least one pattern being (i) a pattern of pixel anodes, or (ii) a pattern of pixel anodes with grid electrodes having lines of electrodes aligned along centers of gaps between the anodes, or (iii) having patterns (i) or (ii) encompassed by a continuous or segmented metal band referred to as a guard ring; and applying a monolithic, segmented or pixelated cathode electrode on top of the passivation oxide layer which is on top of the second surface of the semiconductor.

In one embodiment, the semiconductor wafer can be one of an N-Type semiconductor, a P-Type semiconductor or intrinsic semiconductor. In one embodiment, the grid electrodes can be a steering grid that is biased by a voltage potential equal to or lower than the voltage potential of the anodes. In one embodiment, the guard ring electrode can be biased by a voltage potential equal to or lower than the voltage potential of the anodes. In one embodiment, the semiconductor wafer may comprise Cadmium Zinc Telluride (CZT). In one embodiment, the passivation layer comprises a combination of Tellurium Oxide ($TeO_2$), TeO, CdO, $CdTeO_3$, and/or $TeO_3$. In one embodiment, the passivation oxide layer is grown on the semiconductor wafer using a plasma oxidation process. In one embodiment, the plasma process includes ionizing of gas by coupling energy necessary for plasma creation by: (i) frequencies in the kHz range (e.g., 1-999 kHz), or (ii) frequencies in the MHz range (e.g., 1-999 MHz), or (iii) by frequencies in the microwave (GHz) radiation (e.g., 1-999 GHz), or (iv) by DC high voltage (e.g., 300-800 V), or (v) by discharge mechanism or DC magnetron inside a sputtering or an electron beam chamber. In one embodiment, the gas is an oxidant gas, such as oxygen, or a mixture of gases including oxidant gas, such as oxygen.

In one embodiment, the pixelated anode electrodes and the cathode electrode are formed from a metal, the metal being at least one of indium, gold, platinum, nickel, titanium, chromium, aluminum, their alloys, or a stack of layers including some or all of these metals. In one embodiment, the patterned metal is applied to the semiconductor wafer by physical deposition comprising evaporation or sputtering or by chemical deposition and patterned using photolithography or shadow-mask methods. In one embodiment, the first and second surfaces of the semiconductor wafer are polished simultaneously in a same fabrication step. In one embodiment, the first and second surfaces of the semiconductor wafer are polished in a plurality of different fabrication steps. In one embodiment, the pixelated anode electrodes and the cathode electrode are applied to the semiconductor wafer in a plurality of different fabrication steps.

FIGS. 5A-5D schematically illustrates the steps of forming the encapsulating layer of MN on top of the exposed passivation oxide layer in the regions between the anodes using a lift off method. In some embodiments, the encapsulating layer may be formed on the device shown in FIGS. 4A and 4B using the method illustrated in FIGS. 5A-5D. However, in alternative embodiments, the encapsulating layer may be formed using the method illustrated in FIGS. 5A-5D on radiation detector devices other than those shown in FIGS. 4A and 4B.

Figure 5A:
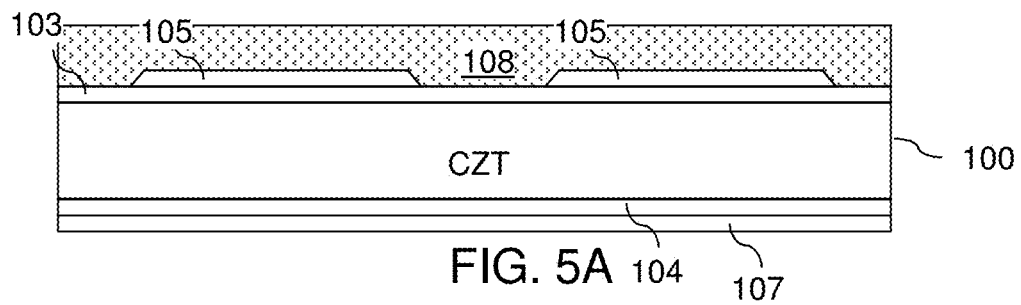
FIGS. 5A-5D schematically illustrate side cross sectional views of the steps of the application of encapsulating layer of MN on top of the exposed passivation oxide layer in the regions between the anodes.

Referring to FIG. 5A, the first passivation oxide layer 103 located the anode side first surface 101 of the wafer 100 and the overlying pattern of metallic contacts (e.g., anodes 105 and optionally steering electrodes 125 and/or guard ring 135) located over the first passivation oxide layer 103 are covered with a mask 108, such as a photoresist mask or another suitable mask, such as any other sacrificial layer such as polymer film and lift-off resists, such as polydimethylglutarimide (pmgi), used to enhance lift-off processes.

Figure 5B:
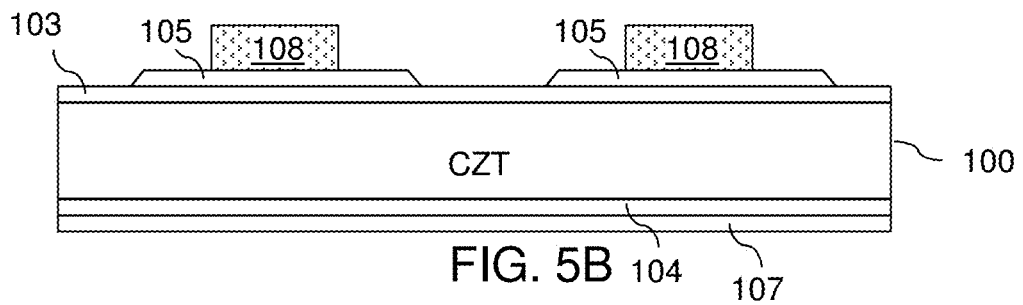

Referring to FIG. 5B, the mask 108 is then exposed and developed in such a way that the area of the developed lift-off mask pattern 108 (e.g., a photoresist or sacrificial mask pattern) is geometrically coincident with the pattern of metallic contacts (e.g., anodes 105 and optionally steering electrodes 125 and/or guard ring 135). The lateral dimensions of the developed lift-off mask 108 pattern are less than the dimensions of the contacts (e.g., the mask patterns are narrower than respective underlying anodes 105).

Figure 5C:
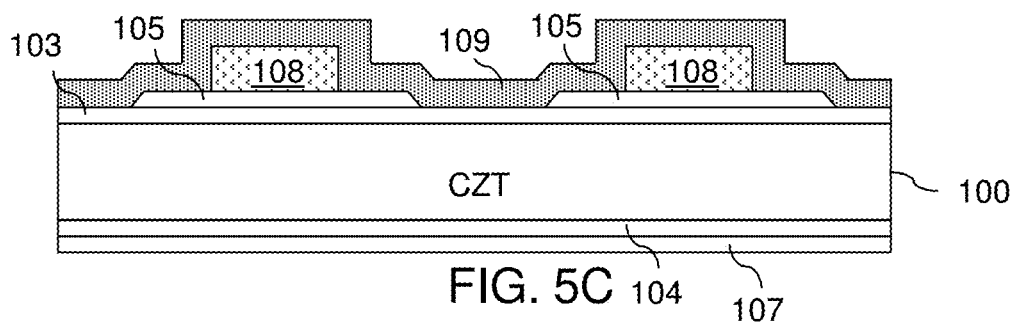

Referring to FIG. 5C, an encapsulating layer 109 of a dielectric material is applied over the first passivation oxide layer 103, the pattern of metallic contacts (e.g., anodes 105, steering grid electrodes 125 and/or guard ring 135) and the developed lift-off mask 108 pattern (i.e., while the photoresist pattern is present). The dielectric material of the encapsulating layer 109 can be, for example, aluminum nitride (AlN). The thickness of the encapsulating layer 109 can be in a range from 3 nm to 1,000 nm, although lesser and greater thicknesses can also be employed.

Figure 5D:
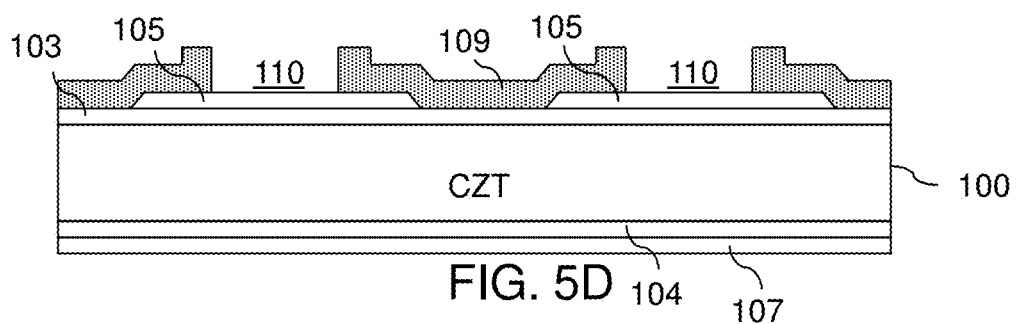

Referring to FIG. 5D, a lift-off technique is employed so that the lift-off mask 108 is lifted off, and openings 110 are formed in the encapsulating layer 109 in areas from which the lift-off mask and an overlying portion of the encapsulating layer 109 are removed. The openings 110 in the encapsulating layer 109 geometrically coincide with center areas of the pattern of metallic contacts (e.g., center of the anodes 105). The lateral dimensions of the openings 110 in the encapsulating layer 109 are less than the dimensions of the underlying pattern of metallic contacts (i.e., the lateral dimension of the openings 110 is narrower than the lateral dimension of the underlying anodes 105 and optionally narrower than the width of the steering grid electrodes and/or guard ring).

In other embodiments, an encapsulating layer can be formed on top of the exposed passivation oxide layer in the regions between the anodes employing a photolithography and two step etching method illustrated in FIGS. 6A-6F. In some embodiments, the encapsulating layer may be formed and patterned on the device shown in FIGS. 4A and 4B using the method illustrated in FIGS. 6A-6F. However, in alternative embodiments, the encapsulating layer may be formed and patterned using the method illustrated in FIGS. 6A-6F on radiation detector devices other than those shown in FIGS. 4A and 4B.

Figure 6A:
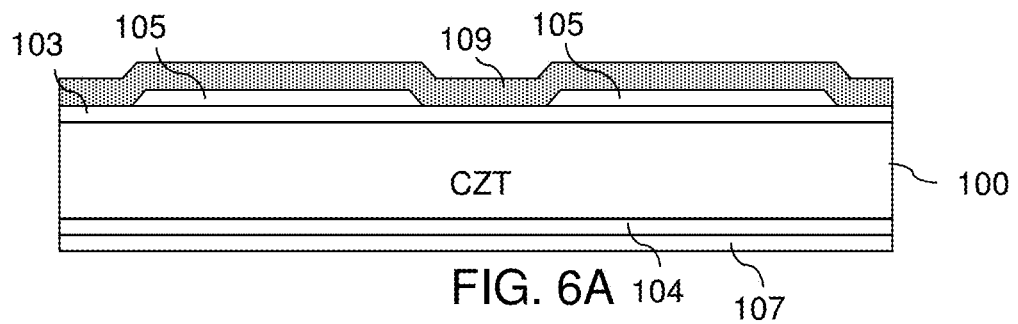
FIGS. 6A-6F schematically illustrate side cross sectional views the steps of another method of application of encapsulating layer of MN on top of the exposed passivation oxide layer in the regions between the anodes.

Referring to FIG. 6A, an encapsulating layer 109 of a dielectric material is formed on top of the first passivation oxide layer 103 and the pattern of metallic contacts (e.g., anodes 105 and optionally steering electrodes 125 and/or guard ring 135). The dielectric material of the encapsulating layer 109 can be, for example, aluminum nitride (AlN). The thickness of the encapsulating layer 109 can be in a range from 3 nm to 1,000 nm, although lesser and greater thicknesses can also be employed.

Figure 6B:
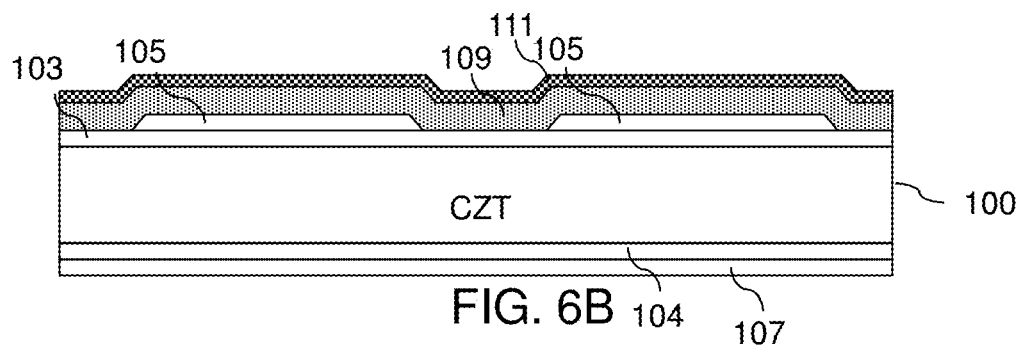

Referring to FIG. 6B, the continuous encapsulating layer 109 (which can include, for example, AlN) is covered with a metallic layer (i.e., metal hard mask) 111, which can be, for example, a thin layer of titanium (Ti), tungsten (W) or tantalum (Ta) or another metal hard mask having a thickness in a range from 3 nm to 300 nm.

Figure 6C:
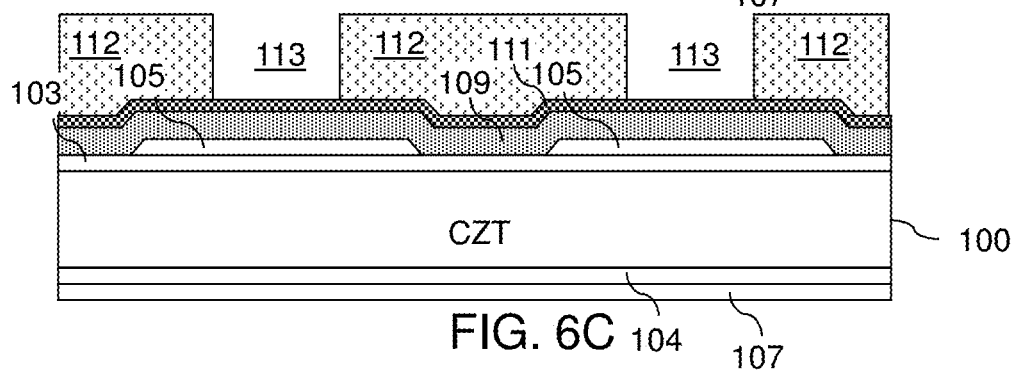

Referring to FIG. 6C, the metallic layer 111 is covered with a photoresist layer 112. The photoresist layer 112 is exposed and developed in such a way as to form openings 113 therein. The openings 113 geometrically coincide with center portions of the pattern of metallic contacts (e.g., anodes 105 and optionally steering electrodes 125 and/or guard ring 135). The lateral dimensions of the openings 113 are less than the lateral dimensions of the anodes 105 (i.e., the width of the openings 113 is narrower than the width of the anodes 105).

Figure 6D:
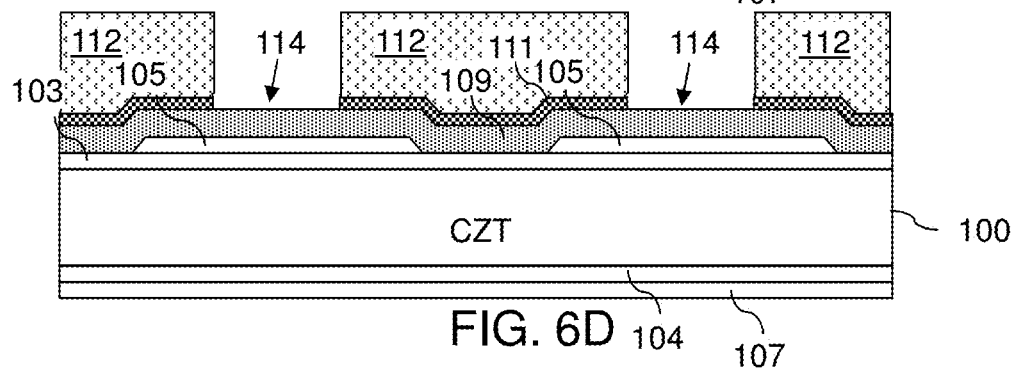

Referring to FIG. 6D, the metallic layer 111 is etched through the openings in the photoresist layer 112. Preferably, a wet etch using an acidic etchant (i.e., having a pH less than 7) is used to etch openings in the metallic layer 111. For example, if the metallic layer 111 includes titanium, a wet etch employing diluted HF acid or a buffered solution of HF can be employed. In one embodiment, the acid etchant that does not attack the underlying encapsulating layer 109 (which may be, for example, an AlN layer) can be employed for the wet etch process. Openings 114 are formed in the metallic layer 111 using the encapsulating layer 109 as an etch stop. The openings 114 geometrically coincide with center portions of the anodes 105. The lateral dimensions of the openings 114 are less than the lateral dimensions of the anodes (i.e., the openings 114 are narrower than the anodes 105). The patterned photoresist 112 may be removed or retained after the step of forming the openings 114 in the metallic layer 111.

Figure 6E:
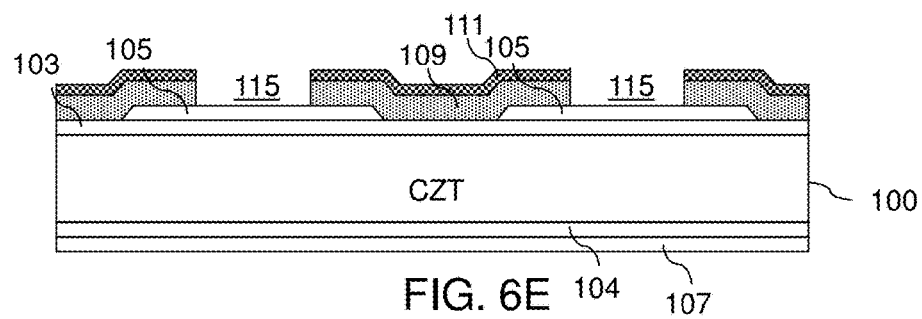

Referring to FIG. 6E, the encapsulating layer 109 is etched through the openings 114 in the metallic layer 111. In one embodiment, a wet etch that etches the material of the encapsulating layer 109 selective to the material of the metallic layer 111 can be employed. Preferably, the wet etch uses a basic etchant (i.e., having a pH greater than 7). For example, in case the encapsulating layer 109 includes AlN, a wet etch employing a potassium hydroxide (KOH) solution or other basic etchants can be performed. Such AlN etchants do not attack the metallic material (such as titanium) or the underlying anodes 105. Thus, openings 115 are formed in the encapsulating layer 109. The openings 115 geometrically coincide with center portions of the pattern of metallic contacts (e.g., anodes 105 and optionally steering electrodes 125 and/or guard ring 135). The lateral dimensions of the openings 115 are less than the lateral dimensions of the pattern of metallic contacts (e.g., the openings 115 are narrower than the respective underlying anodes 105). The two step etching process using the hard mask 111 and both acidic and basic etchants is advantageous because a typical low cost photoresist 112 is typically etched by basic etchants, such as KOH, may be used. Therefore, if the hard mask 111 is omitted, then a special, more expensive photoresist which is not etched by KOH is required as a mask. In contrast, by using the hard mask 111 as an etch stop, a low cost photoresist 112 may be used as a mask for etching the metallic hard mask 111 using an acidic etchant. The photoresist 112 may be removed after this etching step, and the AlN layer 109 may then be etched using the basic etchant using the metallic hard mask 111 as a mask.

Figure 6F:
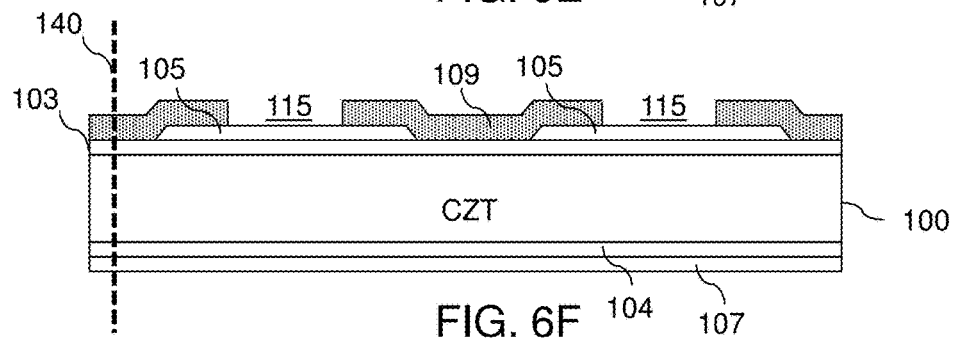

Referring to FIG. 6F, the remaining metallic layer 111 (which can be a titanium layer) can be removed by etching with a diluted HF acid, or with a buffered solution of HF.

Thus, in one embodiment, the method can comprise depositing a layer of aluminum nitride (AlN) as the encapsulating layer on top of the passivation oxide and the overlaid pattern of metallic contacts; and patterning the encapsulating AlN layer in such a way that it has openings coinciding with the anodes, where the dimensions of these openings are smaller than the dimensions of the contacts. The patterning may include the lift off method of FIGS. 5A-5D or the photolithography and two step etching method of FIGS. 6A-6F. If desired, the semiconductor wafer 100 containing the anodes 105 and layer 109 may be diced into tiles through the spaces 106 between the anodes 105 along the dicing lines 140.

Thus, as described above in one embodiment illustrated in FIGS. 5A-5D, the encapsulating layer can be patterned by forming a photoresist pattern on the pattern of metallic contacts such that edge portions of the pixilated anodes are exposed by the photoresist pattern, depositing an AlN encapsulating layer over the edge portion of the pixilated anodes and over the photoresist pattern, and lifting-off the photoresist pattern and portions of the AlN layer encapsulating layer located over the photoresist pattern to form openings in the AlN layer encapsulating layer.

In another embodiment illustrated in FIGS. 6A-6F, the encapsulating layer can be patterned by depositing an aluminum nitride (AlN) encapsulating layer over the pattern of metallic contacts, forming a metallic hard mask layer over the AlN encapsulating layer, forming a photoresist pattern over the metallic hard mask layer, etching portions of the metallic hard mask layer exposed by the photoresist pattern using an acidic etchant and using the AlN encapsulating layer as an etch stop to form hard mask openings in the metallic hard mask layer, and etching portions of the AlN encapsulating layer exposed in the hard mask openings using a basic etchant to form the openings in the AlN encapsulating layer.

Figure 6G:
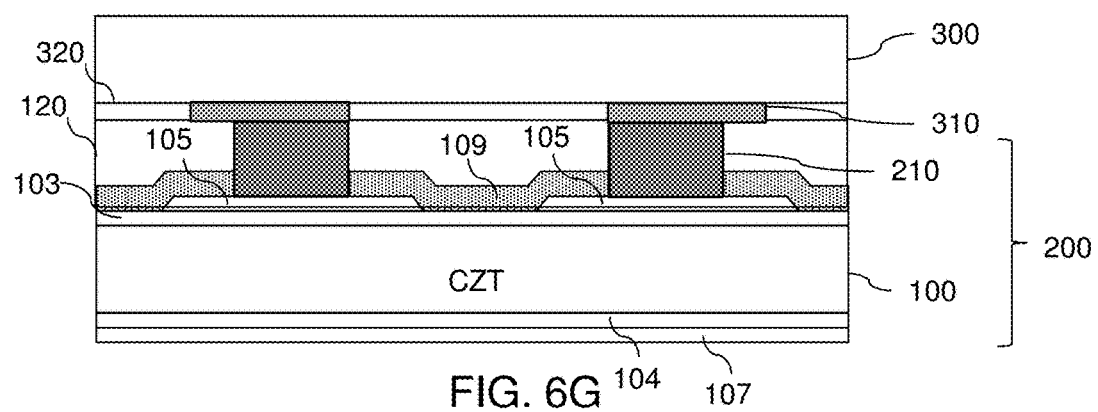
FIG. 6G schematically illustrates a side cross sectional view of attaching the device of FIG. 6F to a carrier.

In one embodiment shown in FIG. 6G, the method can further comprise attaching the radiation detector 200 of FIG. 5D or FIG. 6F to a carrier 300 of electronic devices, such as an ASIC, a pin grid array or a printed circuit board. The carrier 300 has electrical contacts (e.g., electrodes or leads) 310 geometrically matching to the anodes 105. An electrically conductive material 210 is formed in the openings 115 in the encapsulating layer 109 to electrically connect the anodes 105 (and optionally the steering grid 125 and/or the guard ring 135) to the carrier electrical contacts 310. In one embodiment, the conductive material 210 is a conductive epoxy or a low-melting metallic alloy solder. If desired, one or more additional electrically insulating layers 120 and/or 320 may be formed between the carrier 300 and the radiation detector 200.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

The invention claimed is:

1. A method for fabricating a radiation detector, the method comprising:
    mechanically polishing first and second surfaces of a semiconductor wafer using a polishing sequence including a plurality of polishing steps, wherein a last polishing step of the polishing sequence includes polishing with a slurry having a grain size smaller than 0.1 µm to form polished first and second surfaces;
    growing a first passivation oxide layer over the polished first surface and a second passivation oxide layer over the polished second surface, respectively;
    forming patterned metal contacts on top of the first passivation oxide layer, wherein the patterned metal contacts comprise a pattern of pixel anodes;
    forming a monolithic, segmented or pixelated cathode electrode on the second passivation oxide layer;
    depositing an aluminum nitride (AlN) encapsulating layer over the first passivation oxide layer and the patterned metal contacts;
    forming openings in the AlN encapsulating layer coinciding with the patterned metal contacts, wherein a lateral dimension of the openings is narrower than a lateral dimension of the pixel anodes;
    forming a conductive material in the openings in contact with the patterned metal contacts, and attaching the radiation detector to a carrier;
    wherein forming the openings in the AlN encapsulating layer comprises:
        forming a lift-off mask pattern on the patterned metal contacts such that edge portions of the pixilated anodes are exposed by the photoresist pattern;
        depositing the AlN encapsulating layer over the first passivation oxide layer in spaces between the pixel anodes, over the edge portion of the pixel anodes and over the lift-off mask pattern; and
        lifting-off the lift-off mask pattern and portions of the AlN layer encapsulating layer located over the lift-off pattern to form the openings in the AlN layer encapsulating layer.

2. The method of claim 1, wherein the semiconductor wafer is one of an N-Type semiconductor, a P-Type semiconductor or intrinsic semiconductor.

3. The method of claim 1, wherein the patterned metal contacts comprise the pattern of pixel anodes and steering grid electrodes that is biased by a voltage potential equal to or lower than the voltage potential of the pixel anodes.

4. The method of claim 3, the patterned metal contacts comprise the pattern of pixel anodes, steering grid electrodes and a guard ring electrode which is biased by a voltage potential equal to or lower than the voltage potential of the pixel anodes.

5. The method of claim 1, wherein:
    the semiconductor wafer comprises Cadmium Zinc Telluride (CZT); and
    the first and second passivation oxide layers comprise a combination of at least two of Tellurium Oxide ($TeO_2$), TeO, CdO, $CdTeO_3$, and $TeO_3$.

6. The method of claim 5, wherein the first and second passivation oxide layers are grown on the semiconductor wafer using a plasma oxidation process.

7. The method of claim 1, wherein the pixelated anodes and the cathode electrode are formed from a metal selected from least one of indium, gold, platinum, nickel, titanium, chromium, aluminum, alloys thereof, or a stack of layers including some or all of these metals.

8. The method of claim 1, wherein the first and second surfaces of the semiconductor are polished simultaneously in a same fabrication step.

9. The method of claim 1, wherein the first and second surfaces of the semiconductor are polished in a plurality of different fabrication steps.

10. The method of claim 1, wherein the pixelated anodes and the cathode electrode are formed in different fabrication steps.

11. A method for fabricating a radiation detector, the method comprising:
    mechanically polishing first and second surfaces of a semiconductor wafer using a polishing sequence including a plurality of polishing steps, wherein a last polishing step of the polishing sequence includes polishing with a slurry having a grain size smaller than 0.1 µm to form polished first and second surfaces;

growing a first passivation oxide layer over the polished first surface and a second passivation oxide layer over the polished second surface, respectively;

forming patterned metal contacts on top of the first passivation oxide layer, wherein the patterned metal contacts comprise a pattern of pixel anodes;

forming a monolithic, segmented or pixelated cathode electrode on the second passivation oxide layer;

depositing an aluminum nitride (AlN) encapsulating layer over the first passivation oxide layer and the patterned metal contacts; and forming openings in the AlN encapsulating layer coinciding with the patterned metal contacts, wherein a lateral dimension of the openings is narrower than a lateral dimension of the pixel anodes;

wherein forming the openings in the AlN encapsulating layer comprises:

forming a metallic hard mask layer over the AlN encapsulating layer;

forming a photoresist pattern over the metallic hard mask layer;

etching portions of the metallic hard mask layer metal layer exposed by the photoresist pattern using the AlN encapsulating layer as an etch stop to form hard mask openings in the metallic hard mask layer; and etching portions of the AlN encapsulating layer exposed in the hard mask openings to form the openings in the AlN encapsulating layer.

12. The method of claim 11, wherein the portions of the metallic hard mask layer metal layer are etched using an acidic etchant and portions of the AlN encapsulating layer are etched using a basic etchant.

13. A method for fabricating a radiation detector, the method comprising:

forming a first passivation oxide layer on a first surface of the semiconductor wafer;

forming a second passivation oxide layer on a second surface of the semiconductor wafer;

forming patterned metal contacts over the first passivation oxide layer, wherein the patterned metal contacts comprise a pattern of pixel anodes;

forming a cathode electrode over the second passivation oxide layer;

forming a lift-off mask pattern on the patterned metal contacts such that edge portions of the pixilated anodes are exposed by the lift-off mask pattern;

depositing an AlN encapsulating layer over the edge portion of the pixilated anodes and over the lift-off mask pattern; and lifting-off the lift-off mask pattern and portions of the AlN layer encapsulating layer located over the lift-off mask pattern to form openings in the AlN layer encapsulating layer.

14. The method of claim 13, further comprising forming a conductive material in the openings in contact with the patterned metal contacts.

15. A method for fabricating a radiation detector, the method comprising:

forming a first passivation oxide layer on a first surface of the semiconductor wafer;

forming a second passivation oxide layer on a second surface of the semiconductor wafer;

forming patterned metal contacts over the first passivation oxide layer, wherein the patterned metal contacts comprise a pattern of pixel anodes;

forming a cathode electrode over the second passivation oxide layer;

depositing an aluminum nitride (AlN) encapsulating layer over the patterned metal contacts;

forming a metallic hard mask layer over the AlN encapsulating layer;

forming a photoresist pattern over the metallic hard mask layer;

etching portions of the metallic hard mask layer exposed by the photoresist pattern using an acidic etchant and using the AlN encapsulating layer as an etch stop to form hard mask openings in the metallic hard mask layer; and etching portions of the AlN encapsulating layer exposed in the hard mask openings using a basic etchant to form the openings in the AlN encapsulating layer.

16. The method of claim 15, further comprising forming a conductive material in the openings in contact with the patterned metal contacts.

17. The method of claim 15, wherein:

the acidic etchant comprises hydrofluoric acid;

the basic etchant comprises potassium hydroxide;

the patterned metal contacts comprise the pattern of pixel anodes and at least one of steering grid electrodes and a guard ring electrode;

the semiconductor wafer comprises Cadmium Zinc Telluride (CZT);

the passivation oxide layer comprises a combination of at least two of Tellurium Oxide (TeO), TeO, CdO, $CdTeO_3$, and $TeO_3$; and the metallic hard mask layer comprises Ti, W or Ta.

* * * * *